(12) United States Patent
Kobayashi et al.

(10) Patent No.: US 8,759,821 B2
(45) Date of Patent: Jun. 24, 2014

(54) TRANSPARENT ORGANIC ELECTROLUMINESCENT ELEMENT AND PRODUCTION METHOD THEREFOR

(75) Inventors: Yoshihiro Kobayashi, Tokyo-to (JP); Katsunari Obata, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 13/637,808

(22) PCT Filed: Mar. 16, 2011

(86) PCT No.: PCT/JP2011/056280
§ 371 (c)(1),
(2), (4) Date: Sep. 27, 2012

(87) PCT Pub. No.: WO2011/125442
PCT Pub. Date: Oct. 13, 2011

(65) Prior Publication Data
US 2013/0020564 A1    Jan. 24, 2013

(30) Foreign Application Priority Data

Mar. 31, 2010   (JP) ................................ 2010-083057

(51) Int. Cl.
| | |
|---|---|
| *H01L 35/24* | (2006.01) |
| *H01L 51/00* | (2006.01) |
| *H01L 29/04* | (2006.01) |
| *H01L 31/036* | (2006.01) |
| *H01L 21/00* | (2006.01) |

(52) U.S. Cl.
USPC ........... 257/40; 257/72; 257/E51.001; 438/82

(58) Field of Classification Search
USPC ........ 257/40, 59, 72, 449, 749, 759, E51.001, 257/E51.019; 438/46, 82, 99, 48, 570, 623, 438/608, 609, 128, 149, 151, 157, 283
See application file for complete search history.

(56) References Cited

U.S. PATENT DOCUMENTS

| | | | |
|---|---|---|---|
| 2002/0043933 A1* | 4/2002 | Ooishi et al. | 313/512 |
| 2006/0061270 A1* | 3/2006 | Uhlig et al. | 313/506 |

FOREIGN PATENT DOCUMENTS

| | | |
|---|---|---|
| JP | 08-180974 A | 7/1996 |
| JP | 2004-311205 A | 11/2004 |
| JP | 2006-331920 A | 12/2006 |
| JP | 2008-041341 A | 2/2008 |
| JP | 2009-187737 A | 8/2009 |
| JP | 2009-301965 A | 12/2009 |
| JP | 4864142 B2 | 2/2012 |
| WO | 2009/019775 A1 | 2/2009 |

* cited by examiner

*Primary Examiner* — Matthew Reames
*Assistant Examiner* — Dilinh Nguyen
(74) *Attorney, Agent, or Firm* — Ladas & Parry LLP

(57) ABSTRACT

A transparent organic EL element comprising: a transparent substrate, a first transparent electrode layer formed on the transparent substrate in stripe form, an insulating partition wall formed in stripe form in a direction orthogonal to the longitudinal direction of the first transparent electrode layer on the transparent substrate with the first transparent electrode layer formed, an organic EL layer including a light emitting layer and formed on the first transparent electrode layer in the light emitting region between the partition walls, a second transparent electrode layer formed on the organic EL layer and divided with the partition wall, and a first auxiliary electrode group formed on the second transparent electrode layer with a plurality of metal fine lines disposed parallel with each other, characterized in that an angle $\theta_1$ is $0°<\theta_1<90°$.

7 Claims, 9 Drawing Sheets

FIG. 14A
FIG. 14B
FIG. 14C
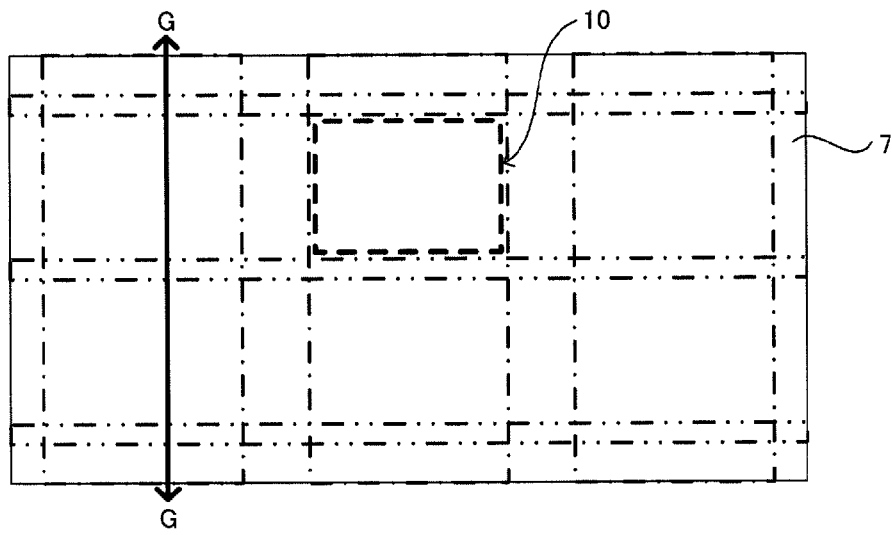
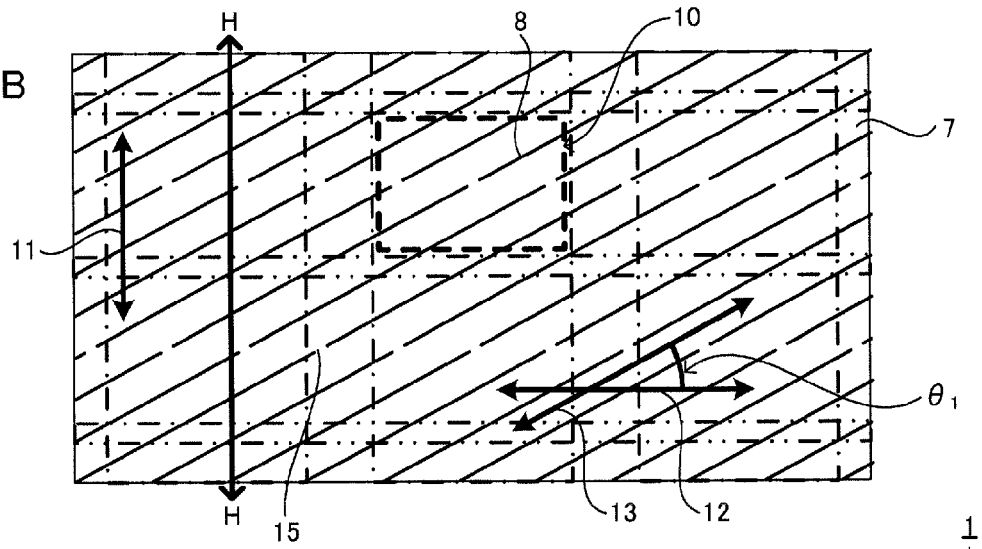
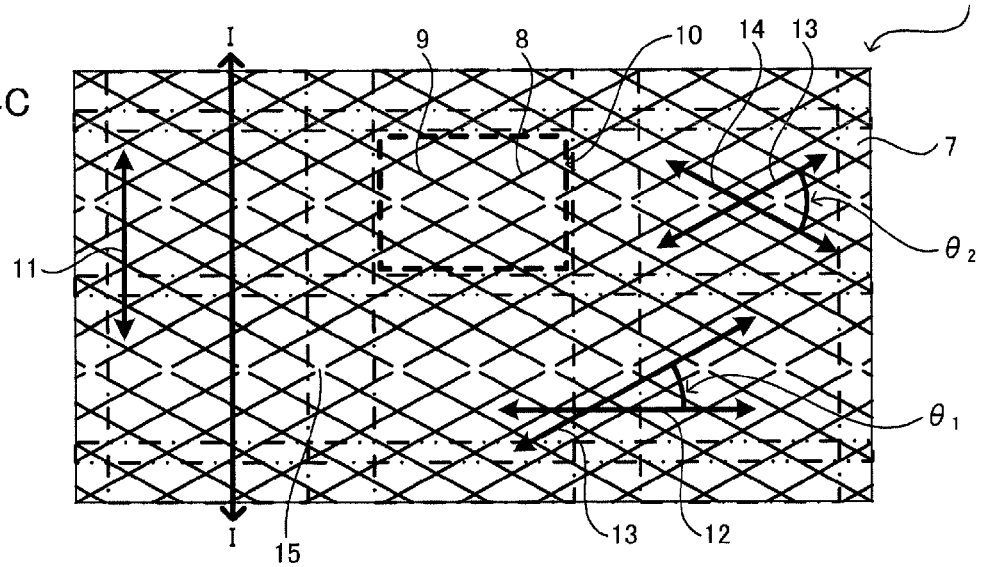

TRANSPARENT ORGANIC ELECTROLUMINESCENT ELEMENT AND PRODUCTION METHOD THEREFOR

TECHNICAL FIELD

The present invention relates to a passive type organic electroluminescent element comprising a partition wall, while also comprising an auxiliary electrode formed on a second electrode layer for lowering the resistance.

BACKGROUND ART

Since the organic electroluminescent (hereafter, electroluminescent may be abbreviated as EL) element comprising an organic light emitting layer interposed between a pair of electrodes for applying voltage between the electrodes for emitting a light are advantageous for having: high visibility owing to self color development, excellent impact resistance for being an all solid element unlike the liquid crystal elements, high response speed, little influence by the temperature change, wide view angle, and the like so that utilization as a light emitting element in a display device attracts attention.

In such an organic EL element, in the case of producing a transparent panel having a first electrode and a second electrode disposed on both sides of an organic light emitting layer as transparent electrodes, a problem of display irregularity has been brought about due to high resistance of the second electrode.

Then, for lowering the resistance of the second electrode, a method of forming an auxiliary electrode for the second electrode on a glass substrate for connecting the same by a through hole has been proposed (see Patent Literature 1). However, due to increase of producing steps, the method involves a problem of complication. On the other hand, a method of forming an auxiliary electrode directly on a second electrode has been proposed (see Patent Literature 2). However, since the auxiliary electrode is formed between the light emitting elements disposed according to a matrix arrangement in this method, a problem is involved in that alignment adjustment is difficult.

CITATION LIST

Patent Literature

Patent Literature 1: Japanese Patent Application Laid-Open (JP-A) No. 2006-331920
Patent Literature 2: JP-A No. 2009-187737

SUMMARY OF THE INVENTION

Technical Problem

The present invention has been achieved in view of the above-mentioned problems, and a main object thereof is to provide a transparent organic EL element capable of certainly forming an auxiliary electrode on a second electrode layer in a simple process while reducing the resistance in the second electrode layer without the risk of causing short-circuit even in the case they are out of alignment, and its production method.

Solution to Problem

In order to achieve the above-mentioned object, the present invention provides a transparent organic EL element comprising: a transparent substrate, a first transparent electrode layer formed on the above-mentioned transparent substrate in stripe form, an insulating partition wall formed in stripe form in a direction orthogonal to the longitudinal direction of the first transparent electrode layer on the above-mentioned transparent substrate with the above-mentioned first transparent electrode layer formed, an organic EL layer including a light emitting layer and formed on the above-mentioned first transparent electrode layer in a light emitting region between the above-mentioned partition walls, a second transparent electrode layer formed on the above-mentioned organic EL layer and divided with the above-mentioned partition wall, and a first auxiliary electrode group formed on the above-mentioned second transparent electrode layer and comprising a plurality of metal fine lines disposed parallel with each other, characterized in that an angle $\theta_1$ is $0°<\theta_1<90°$ with the premise that an angle formed by a longitudinal direction of the above-mentioned partition wall and an elongation direction of the fine lines of the above-mentioned first auxiliary electrode group is $\theta_1$, and/or a pitch of the fine lines of the above-mentioned first auxiliary electrode group is narrower than a pitch of the above-mentioned partition walls.

According to the present invention, since the angle formed by the longitudinal direction of the partition wall and the fine line elongation direction of the first auxiliary electrode group is $0°<\theta_1<90°$, and/or the pitch of the fine lines of the first auxiliary electrode group is narrower than the pitch of the partition walls, the first auxiliary electrode group is formed certainly on the second transparent electrode layer formed in the light emitting region between the partition walls so that the resistance of the second transparent electrode layer is lowered even in the case they are out of alignment. Moreover, since the partition walls are formed, there is no risk of short-circuit.

In the above-mentioned invention, it is preferable that a second auxiliary electrode group is formed on the above-mentioned second transparent electrode layer so as to intersect the above-mentioned first auxiliary electrode group and comprises a plurality of metal fine lines disposed parallel with each other so that an angle $\theta_2$ is $0°<\theta_2\leq90°$ with the premise that an angle formed by the elongation direction of the fine lines of the above-mentioned first auxiliary electrode group and an elongation direction of the fine lines of the above-mentioned second auxiliary electrode group is $\theta_2$, and the above-mentioned first auxiliary electrode group and the above-mentioned second auxiliary electrode group are provided continuously without a break along the longitudinal direction of the above-mentioned partition wall. Since the auxiliary electrodes are formed continuously from one end to the other end on the second transparent electrode layer formed in the light emitting region between the partition walls, the resistance of the second transparent electrode layer can further be lowered. Moreover, since the contact between the first auxiliary electrode group and the second auxiliary electrode group can be ensured even in the case the auxiliary electrodes are out of alignment and furthermore, short-circuit is not caused owing to the partition walls, it is not necessary to adjust the alignment of the auxiliary electrodes.

Moreover, the present invention provides a production method for a transparent organic EL element comprising: a transparent substrate, a first transparent electrode layer formed on the above-mentioned transparent substrate in stripe form, an insulating partition wall formed in stripe form in a direction orthogonal to a longitudinal direction of the first transparent electrode layer on the above-mentioned transparent substrate with the above-mentioned first transparent electrode layer formed, an organic EL layer including a light emitting layer and formed on the above-mentioned first transparent electrode layer in a light emitting region between the above-mentioned partition walls, a second transparent electrode layer formed on the above-mentioned organic EL layer and divided with the above-mentioned partition wall, a first auxiliary electrode group formed on the above-mentioned second transparent electrode layer and comprising a plurality of metal fine lines disposed parallel with each other, and a second auxiliary electrode group formed on the above-mentioned second transparent electrode layer so as to intersect the above-mentioned first auxiliary electrode group and comprising a plurality of metal fine lines disposed parallel with each other, comprising steps of: a first auxiliary electrode group forming step of forming the above-mentioned first auxiliary electrode group so that an angle $\theta_1$ is $0°<\theta_1<90°$ with the premise that an angle formed by the longitudinal direction of the above-mentioned partition wall and an elongation direction of the fine lines of the above-mentioned first auxiliary electrode group is $\theta_1$, and a second auxiliary electrode group forming step of forming the above-mentioned second auxiliary electrode group so that an angle $\theta_2$ is $0°<\theta_2\leq90°$ with the premise that an angle formed by the elongation direction of the fine lines of the above-mentioned first auxiliary electrode group and an elongation direction of the fine lines of the above-mentioned second auxiliary electrode group is $\theta_2$.

According to the present invention, since the auxiliary electrodes are formed by forming the first auxiliary electrode group and the second auxiliary electrode group each by a predetermined angle direction so as to intersect each other, the auxiliary electrodes can be formed certainly and easily on the second transparent electrode layer formed in the light emitting region between the partition walls continuously without a break so that the resistance of the second transparent electrode layer can be lowered. Moreover, since the contact between the first auxiliary electrode group and the second auxiliary electrode group can be ensured even in the case the auxiliary electrodes are out of alignment and furthermore, short-circuit is not caused owing to the partition walls, it is not necessary to adjust the alignment of the auxiliary electrodes so that the production tact can be shortened.

Advantageous Effects of Invention

According to the present invention, effects of certainly forming an auxiliary electrode on a second electrode layer by a simple process, and lowering the resistance of the second electrode layer without causing short-circuit even in the case they are out of alignment can be achieved.

BRIEF DESCRIPTION OF DRAWINGS

FIGS. 14A to 14C are a process diagram showing an example of a production method for a transparent organic EL element of the present invention.

DESCRIPTION OF EMBODIMENTS

Hereafter, the transparent organic EL element and the production method for a transparent organic EL element of the present invention will be explained in detail.
A. Transparent Organic EL Element
First, the transparent organic EL element of the present invention will be explained. The transparent organic EL element of the present invention comprises: a transparent substrate, a first transparent electrode layer formed on the above-mentioned transparent substrate in stripe form, an insulating partition wall formed in stripe form in a direction orthogonal to the longitudinal direction of the first transparent electrode layer on the above-mentioned transparent substrate with the above-mentioned first transparent electrode layer formed, an organic EL layer including a light emitting layer formed on the above-mentioned first transparent electrode layer in the light emitting region between the above-mentioned partition walls, a second transparent electrode layer formed on the above-mentioned organic EL layer and divided with the above-mentioned partition walls, and a first auxiliary electrode group formed on the above-mentioned second transparent electrode layer and comprising a plurality of metal fine lines disposed parallel with each other, characterized in that an angle $\theta_1$ is $0°<\theta_1<90°$ with the premise that an angle formed by the longitudinal direction of the above-mentioned partition wall and the elongation direction of the fine lines of the above-mentioned first auxiliary electrode group is $\theta_1$, and/or the pitch of the fine lines of the above-mentioned first auxiliary electrode group is narrower than the pitch of the above-mentioned partition walls.

Figure 1:
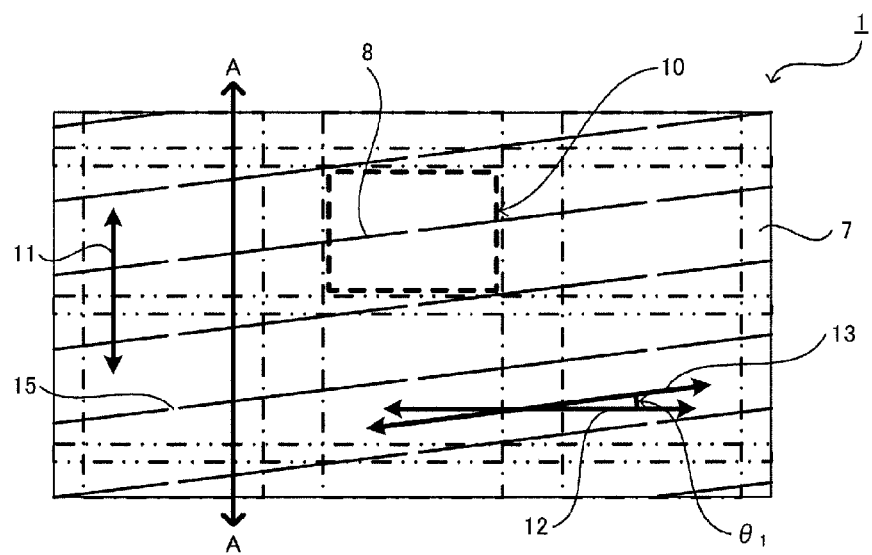
FIG. 1 is a schematic plan view showing an example of a transparent organic EL element of the present invention.
Figure 2:
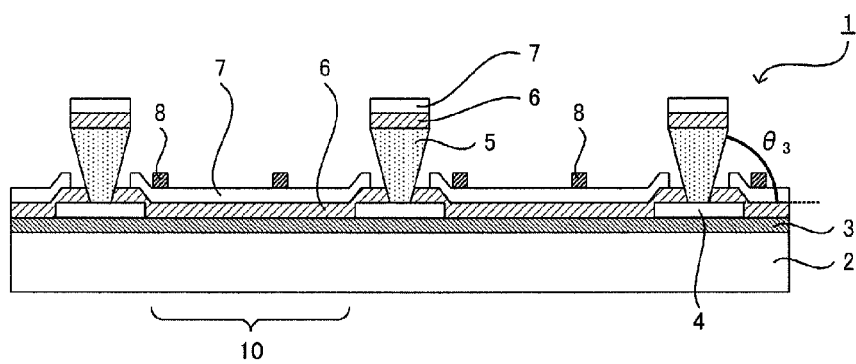
FIG. 2 is a cross-sectional view taken on the line A-A of FIG. 1.

The transparent organic EL element of the present invention will be explained with reference to the drawings. FIG. 1 is a schematic plan view showing an example of a transparent organic EL element of the present invention, and FIG. 2 is a cross-sectional view taken on the line A-A of FIG. 1. FIG. 1 shows the first transparent electrode layer 3 by an alternate long and short dash line and the partition wall 5 by a chain double-dashed line.

The transparent organic EL element 1 shown in FIGS. 1 and 2 comprises the transparent substrate 2, first transparent electrode layers 3 formed on the transparent substrate 2 in stripe form, an insulation layer 4 formed on the transparent substrate 2 with the first transparent electrode layer 3 formed and so as the first transparent electrode layer 3 in a light emitting region 10 is exposed, insulating partition walls 5 formed in stripe form in a direction orthogonal to the longitudinal direction 11 of the first transparent electrode layers on the insulation layer 4, the organic EL layer 6 including a light emitting layer formed on the first transparent electrode layer 3 in the light emitting region 10 between the partition walls 5, the second transparent electrode layer 7 divided by the partition walls 5 and formed on the organic EL layer 6, and the first auxiliary electrode group 8 formed on the second transparent electrode layer 7 and comprises a plurality of metal fine lines disposed parallel with each other.

Figure 3:
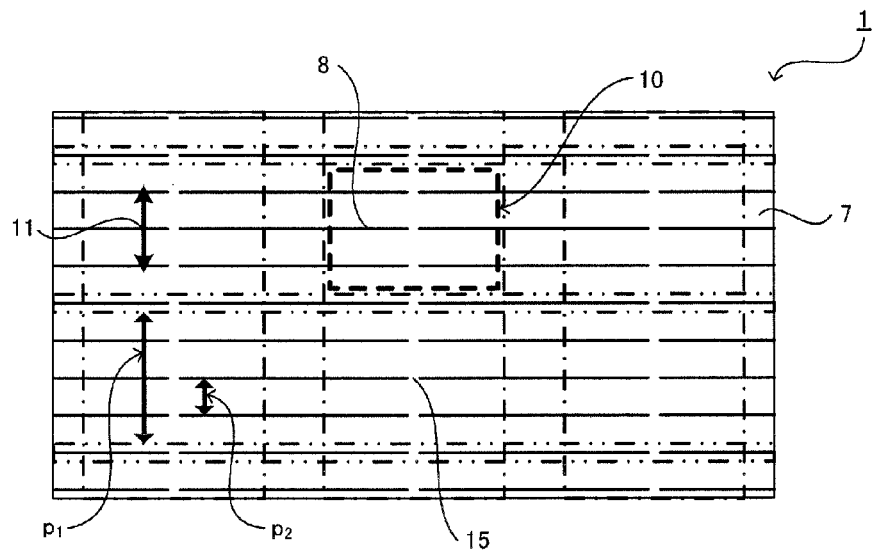
FIG. 3 is a schematic plan view showing another example of a transparent organic EL element of the present invention.

The first auxiliary electrode group 8 is formed so that the angle $\theta_1$ formed by the longitudinal direction 12 of the partition walls and the elongation direction 13 of the fine lines of the first auxiliary electrode group is $0°<\theta_1<90°$ as shown in FIG. 1, or the pitch $p_2$ of the fine lines of the first auxiliary electrode group 8 is narrower than the pitch of the partition walls 5 as shown in FIG. 3. Incidentally, FIG. 3 is a schematic plan view showing another example of a transparent organic EL element of the present invention. Also in this figure the first transparent electrode layer 3 is shown by an alternate long and short dash line and the partition wall 5 by a chain double-dashed line.

According to the present invention, since the angle formed by the longitudinal direction of the partition walls and the elongation direction of the fine lines of the first auxiliary electrode group satisfies $0°<\theta_1<90°$, and/or the pitch of the fine lines of the first auxiliary electrode group is narrower than the pitch of the partition walls, the first auxiliary electrode group can be formed certainly on the second transparent electrode layer formed in the light emitting region between the partition walls so that the resistance of the second transparent electrode layer can be lowered even in the case they are out of alignment. Moreover, since the partition walls are formed, short-circuit is not generated.

Incidentally, the "light emitting region" denotes a region, which contributes to the light emission. Moreover, "parallel" in the present invention includes not only the case of a general parallel state but also a state with a plurality of straight lines on the same plane disposed in the same direction not immediately intersect with each other. Specifically, it is a state with the straight lines arranged in the direction in a range of 0° to 10°.

Moreover, the "pitch of the partition walls" refers to the distance from a partition wall upper bottom surface end part on the light emitting region side of a partition wall to a partition all upper surface end part of another partition wall between adjacent partition walls. The "pitch of the fine lines of the first auxiliary electrode group" denotes a distance from a fine line center to another fine line center between adjacent fine lines out of a plurality of metal fine lines disposed parallel with each other in the first auxiliary electrode group. They can be measured with an optical microscope, a laser microscope, or a scanning type white color interferometer.

Hereafter, each configuration in the transparent organic EL element of the present invention will be explained.

1. First Auxiliary Electrode Group

The first auxiliary electrode group in the present invention is formed on the second transparent electrode layer and comprises a plurality of metal fine lines disposed parallel with each other. Owing to the first auxiliary electrode group, the resistance of the second transparent electrode layer can be reduced. The first auxiliary electrode group in the present invention can roughly be classified into an embodiment wherein an angle $\theta_1$ is $0°<\theta_1<90°$ with the premise that the angle formed by the longitudinal direction of the partition walls and the elongation direction of the fine lines of the first auxiliary electrode group is $\theta_1$ (first embodiment), and an embodiment wherein the pitch of the fine lines of the first auxiliary electrode group is narrower than the pitch of the partition walls (second embodiment). Hereafter, the embodiments will be explained, respectively.

(1) First Embodiment

The first auxiliary electrode group of the present embodiment is characterized in that an angle $\theta_1$ is $0°<\theta_1<90°$ with the premise that the angle formed by the longitudinal direction of the partition walls and the elongation direction of the fine lines of the first auxiliary electrode group is $\theta_1$.

According to the present embodiment, since the $\theta_1$ is $0°<\theta_1<90°$, even in the case the pitch of the fine lines of the first auxiliary electrode group is wider than the pitch of the partition walls, since the longitudinal direction of the partition walls and the elongation direction of the fine lines of the first auxiliary electrode group are not parallel but have an inclination, the first auxiliary electrode group is formed certainly on the second transparent electrode layer formed in the light emitting region between the partition walls so that the resistance of the second transparent electrode layer can be lowered even in the case they are out of alignment. Moreover, since the partition walls are formed, short-circuit is not generated.

In the present embodiment, the angle $\theta_1$ formed by the longitudinal direction of the partition walls and the elongation direction of the fine lines of the first auxiliary electrode group may be $0°<\theta_1<90°$. However, for the fine lines of the first auxiliary electrode group can be formed longer between the partition walls with a smaller $\theta_1$ so as to function certainly as an auxiliary electrode, it is more preferably $0°<\theta_1<45°$, and it is further preferably $0°<\theta_1<20°$.

Moreover, the first auxiliary electrode group may be formed so that a plurality of the metal fine lines are provided parallel with an angle in the above-mentioned range without the need of being formed completely parallel with each other, however, it is preferable that they are formed completely parallel with each other. Incidentally, the first auxiliary electrode group may be formed either on the partition walls or not on the partition walls as long as it is formed at least on the second transparent electrode layer formed in the light emitting region between the partition walls.

The pitch of the fine lines of the first auxiliary electrode group of the present embodiment is preferably same as or smaller than the pitch of the partition walls because a plurality of the fine lines of the first auxiliary electrode group can be disposed between the partition walls at the same time so as to perform the function as the auxiliary electrodes further effectively. Moreover, the pitch of the fine lines of the first auxiliary electrode is selected optionally according to the angle $\theta_1$ formed by the longitudinal direction of the partition walls and the elongation direction of the fine lines of the first auxiliary electrode group so that it may be either constant or not constant. Incidentally, even in the case the pitch of the fine lines of the first auxiliary electrode group is same as or larger than the pitch of the partition walls, since the $\theta_1$ is $0°<\theta_1<90°$, the first auxiliary electrode group can be formed certainly on the second transparent electrode layer formed in the light emitting region between the partition walls.

Moreover, the width of the fine lines of the first auxiliary electrode group of the present embodiment is preferably in a range of 5 μm to 300 μm, and it is more preferably in a range of 5 μm to 100 μm. If the width of the fine lines of the first auxiliary electrode group is wider than the above-mentioned range, the light emitting region is hindered so that the aperture ratio of the pixels is lowered. On the other hand, if the width of the fine lines of the first auxiliary electrode group is narrower than the above-mentioned range, slits of the metal mask used at the time of forming the first auxiliary electrode group become also narrow so that the slits can easily be closed by a deposition source, and thus formation of the first auxiliary electrode group can be difficult. Moreover, production of the metal mask itself with such a narrow slit for forming the first auxiliary electrode group is difficult.

The material for the metal fine lines constituting the first auxiliary electrode group of the present embodiment is not particularly limited as long as it is a metal material having a resistance lower than that of the second transparent electrode layer. Specifically, Al, Ag, Au, Cu, Ni, Cr, Mo, Mg, and the like can be presented. In particular, Al, Ag, Au, and Mo are preferable.

As the method for forming the first auxiliary electrode group of the present embodiment, a method of forming an electrode using a metal mask can be used. For example, general deposition methods using a metal mask such as the vacuum deposition process, the sputtering process, and the ion plating process, and the method of applying a metal paste using a metal mask can be presented. As the metal mask, it is preferable to use those preliminarily having a cut in the slits because rigidity can be ensured by preventing deflection at the time of forming the first auxiliary electrode group. Since such a metal mask with a cut in the slits is used, the first auxiliary electrode group 8 has a disconnecting part 15 in the transparent organic EL element 1 shown in FIG. 1.

Moreover, since the transparent organic EL element of the present invention has a partition wall to be described later, it can be formed easily on the second transparent electrode layer formed in the light emitting region between the partition walls without generating short-circuit in the first auxiliary electrode group by the above-mentioned forming method.

(2) Second Embodiment

The first auxiliary electrode group of the present embodiment is characterized in that the pitch of the fine lines of the first auxiliary electrode group is narrower than the pitch of the partition walls.

According to the present embodiment, since the pitch of the fine lines of the first auxiliary electrode group is narrower than the pitch of the partition walls, even in the case the longitudinal direction of the partition wall and the elongation direction of the fine lines of the first auxiliary electrode group are parallel with each other, the first auxiliary electrode group can be formed certainly on the second transparent electrode layer formed in the light emitting region between the partition walls so that the resistance of the second transparent electrode layer can be lowered even if they are out of alignment.

The pitch of the fine lines of the first auxiliary electrode group of the present embodiment is not particularly limited as long as it is narrower than the pitch of the partition walls so that it can be selected optionally according to the angle $\theta_1$ formed by the longitudinal direction of the partition walls and the elongation direction of the fine lines of the first auxiliary electrode group so that it may either be constant or not constant. Incidentally, in general, if the pitch of the fine lines of the first auxiliary electrode group is too wide, the first auxiliary electrode group formed on the second transparent electrode layer is reduced so that the effect of lowering the resistance of the second transparent electrode layer is made smaller. If the pitch of the fine lines of the first auxiliary electrode group is too narrow, the first auxiliary electrode group formed on the second transparent electrode layer is increased so that the light emitting region is inhibited, and thus the aperture ratio of the pixels is lowered.

In the present embodiment, the angle $\theta_1$ formed by the longitudinal direction of the partition walls and the elongation direction of the fine lines of the first auxiliary electrode group is not particularly limited. Even in the case $\theta_1=0°$, since the pitch of the fine lines of the first auxiliary electrode group is narrower than the pitch of the partition ails, the first auxiliary electrode group can be formed certainly on the second transparent electrode layer formed in the light emitting region between the partition walls.

Since the other points of the first auxiliary electrode group of the present embodiment are same as those in the above-mentioned first embodiment, explanation is omitted here.

2. Second Auxiliary Electrode Group

In the present invention, it is preferable that a second auxiliary electrode group is formed on the second transparent electrode layer so as to intersect the first auxiliary electrode group and comprises a plurality of metal fine lines disposed parallel with each other so that a $\theta_2$ is $0°<\theta_2\leq 90°$ with the premise that the angle formed by the elongation direction of the fine lines of the first auxiliary electrode group and the elongation direction of the fine lines of the second auxiliary electrode group is $\theta_2$, and the first auxiliary electrode group and the second auxiliary electrode group are provided continuously without a break along the longitudinal direction of the partition walls. Since the auxiliary electrodes are formed continuously from one end to the other end on the second transparent electrode layer formed in the light emitting region between the partition walls, the resistance of the second transparent electrode layer can further be lowered. Moreover, since the contact between the first auxiliary electrode group and the second auxiliary electrode group can be ensured even in the case the auxiliary electrodes are out of alignment and furthermore, short-circuit is not caused owing to the partition walls, it is not necessary to adjust the alignment of the auxiliary electrodes.

Figure 4:
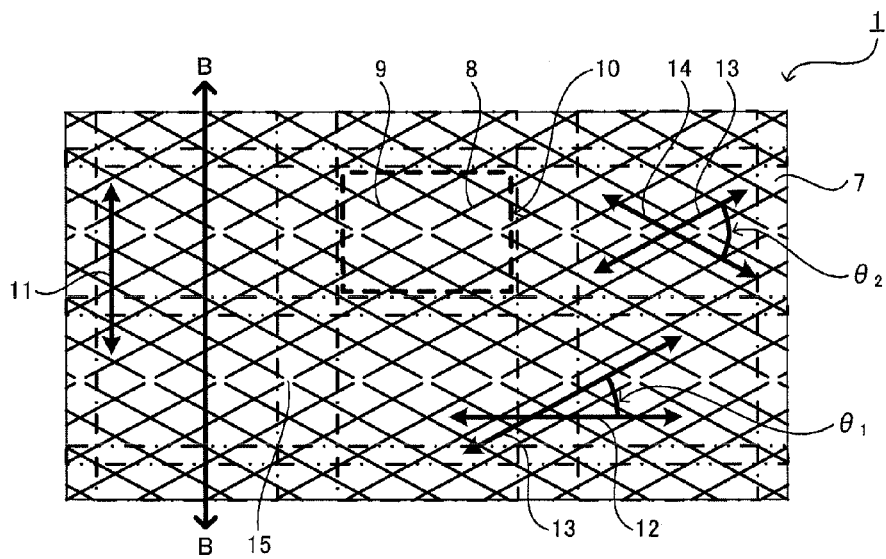
FIG. 4 is a schematic plan view showing another example of a transparent organic EL element of the present invention.
Figure 5:
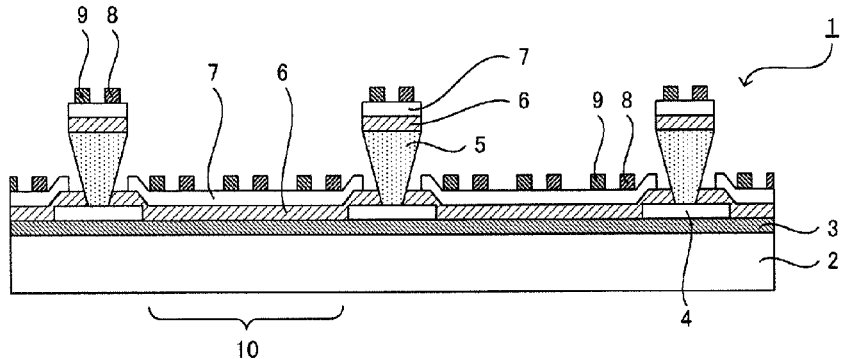
FIG. 5 is a cross-sectional view taken on the line B-B of FIG. 4.

In the case the transparent organic EL element of the present invention further comprises the second auxiliary electrode group, as shown in FIGS. 4 and 5, the first auxiliary electrode group 8 and the second auxiliary electrode group 9 intersecting with each other are formed on the second transparent electrode layer 7. With the premise that the angle formed by the longitudinal direction 12 of the partition walls and the elongation direction 13 of the fine lines of the first auxiliary electrode group is $\theta_1$, and that the angle formed by the elongation direction 13 of the fine lines of the first auxiliary electrode group and the elongation direction 14 of the fine lines of the second auxiliary electrode group is $\theta_2$, $0°<\theta_1<90°$ and $0°<\theta_2\leq 90°$, with the first auxiliary electrode group 8 and the second auxiliary electrode group 9 provided continuously without a break along the longitudinal direction 12 of the partition walls.

Figure 6:
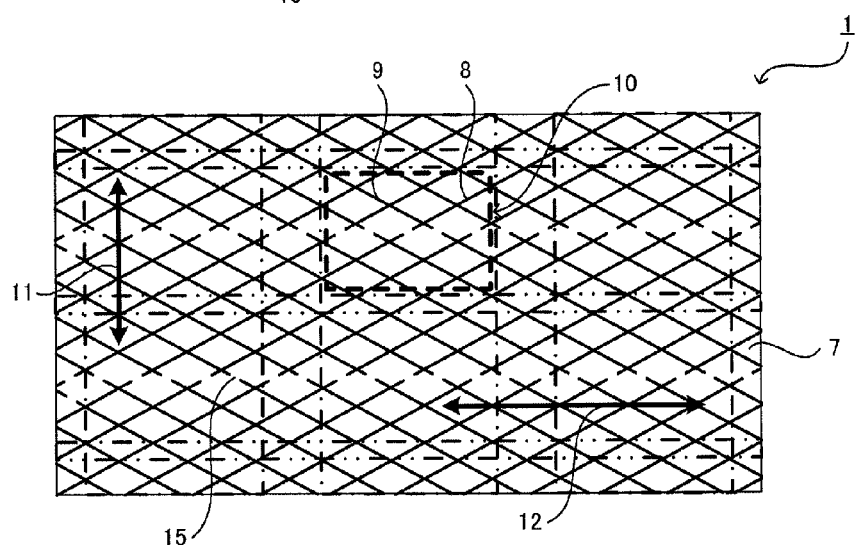
FIG. 6 is a schematic plan view showing another example of a transparent organic EL element of the present invention.
Figure 7:
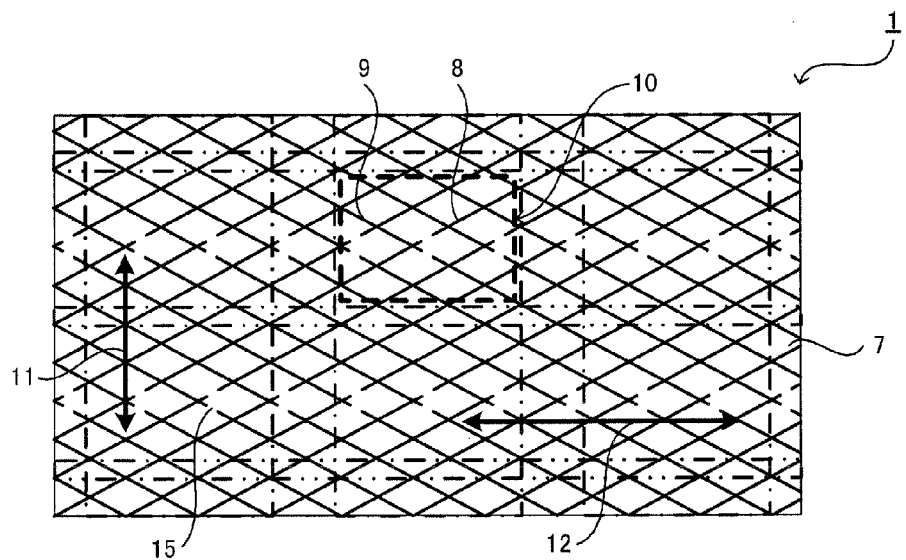
FIG. 7 is a schematic plan view showing another example of a transparent organic EL element of the present invention.

Moreover, as shown in FIGS. 6 and 7, even in the case the second auxiliary electrode group 9 is displaced in the longitudinal direction 12 of the partition walls, or in the direction orthogonal to the longitudinal direction 12 of the partition walls, by controlling the pitch of the fine lines of the second auxiliary electrode group 9 and the pitch of the disconnecting part 15, the contact of the first auxiliary electrode group 8 and the second auxiliary electrode group 9 is ensured on the second transparent electrode layer 7 formed in the light emitting region 10 between the partition walls 5. Thereby, a transparent organic EL element with the auxiliary electrode formed continuously on the second transparent electrode layer in the light emitting region between the partition walls can be provided.

Incidentally, FIGS. 4, 6 and 7 are each a schematic plan view showing another example of the transparent organic EL element of the present invention. FIG. 5 is a cross-sectional view taken on the line B-B of FIG. 4. FIGS. 4, 6 and 7 show the first transparent electrode layer 3 by an alternate long and short dash line and the partition wall 5 by a chain double-dashed line.

In the present invention, the angle $\theta_2$, formed by the elongation direction of the fine lines of the first auxiliary electrode group and the elongation direction of the fine lines of the second auxiliary electrode group, may be $0°<\theta_2\leq90°$. However, it is more preferably $0°<\theta_2<45°$, and it is further preferably $0°<\theta_2<30°$.

The second auxiliary electrode group may comprise a plurality of metal fine lines formed parallel with each other so as to form an angle in the above-mentioned range. They may not be completely parallel, however, it is preferable that they are formed completely parallel with each other. The second auxiliary electrode group may be symmetrical or asymmetrical with the first auxiliary electrode group. Incidentally, the second auxiliary electrode group may be formed either on or not on the partition walls as long as at least it is formed in the light emitting region between the partition walls.

In the present invention, it is further preferable that $0°<\theta_1<20°$ and $0°<\theta_2<30°$. By controlling the pitch of the fine lines of the second auxiliary electrode group and the pitch of the disconnecting part of the second auxiliary electrode group with $\theta_1$ and $\theta_2$ in the above-mentioned range, the first auxiliary electrode group and the second auxiliary electrode group are provided continuously between the partition walls without a break along the longitudinal direction of the partition walls. Incidentally, the "pitch of the fine lines of the second auxiliary electrode group" denotes a distance from a fine line center to another fine line center between adjacent fine lines out of a plurality of metal fine lines disposed parallel in the second auxiliary electrode group. The "pitch of the disconnecting part of the second auxiliary electrode group" denotes a distance from a disconnecting center to another disconnecting center between adjacent disconnecting parts out of a plurality of disconnecting parts provided in a metal fine line constituting the second auxiliary electrode group. They can be measured with an optical microscope, a laser microscope, or a scanning type white color interferometer.

The pitch of the fine lines of the second auxiliary electrode group is not particularly limited as long as it can intersect the first auxiliary electrode group so that it is selected optionally according to the angle $\theta_2$ formed by the elongation direction of the fine lines of the first auxiliary electrode group and the elongation direction of the fine lines of the second auxiliary electrode group so that it may be either constant or not constant. Incidentally, in general, if the pitch of the fine lines of the second auxiliary electrode is too wide, the second electrode group formed on the second transparent electrode layer is reduced so that the effect of lowering the resistance of the second transparent electrode layer is made smaller. If the pitch of the fine lines of the second auxiliary electrode group is too narrow, the second auxiliary electrode group formed on the second transparent electrode layer is increased so that the light emitting region is inhibited, and thus the aperture ratio of the pixels is lowered.

The width of the fine lines of the second auxiliary electrode group is preferably in a range of 5 μm to 300 μm, and it is more preferably in a range of 5 μm to 100 μm. If the width of the fine lines of the second auxiliary electrode group is wider than the above-mentioned range, the light emitting region is hindered so that the aperture ratio of the pixels is lowered. On the other hand, if the width of the fine lines of the second auxiliary electrode group is narrower than the above-mentioned range, slits of the metal mask used at the time of forming the second auxiliary electrode group become also narrow so that the slits can easily be closed by a deposition source, and thus formation of the second auxiliary electrode group can be difficult. Moreover, production of the metal mask itself with such a narrow slit for forming the second auxiliary electrode group is difficult.

Moreover, since the material and method for forming the second auxiliary electrode group are same as the forming material and the forming method for the first auxiliary electrode group, explanation is omitted here. Incidentally, since the second auxiliary electrode group uses a metal mask with the slits cut as in the case of the first auxiliary electrode group, in each of the transparent organic EL element 1 shown in FIGS. 4, 6 and 7, the second auxiliary electrode group 9 also has a disconnecting part 15.

The material for forming the second auxiliary electrode group may either be same as the material for forming the first auxiliary electrode group or it may be a different material.

The pitch of the disconnecting part of the second auxiliary material is not particularly limited as long as the first auxiliary electrode group and the second auxiliary electrode group are provided continuously between the partition walls without a break along the longitudinal direction of the partition walls.

3. Partition Wall

Next, the partition wall in the present invention will be explained. The partition walls in the present invention are formed in stripe form in a direction orthogonal to the longitudinal direction of the first transparent electrode layer. The partition walls have an insulation property and are provided for dividing the second transparent electrode layer plurally.

Since the first transparent electrode layer is formed in general in stripe form in the case of a passive type transparent organic EL element, the partition walls are also formed in stripe form so as to be orthogonal to the longitudinal direction of the first transparent electrode layer in stripe form.

Since the second transparent electrode layer can be divided plurally as long as the partition walls have a predetermined height, the cross-sectional shape of the partition walls is not particularly limited. For example, rectangular, trapezoidal (ordinary tapered shape), and inversely tapered shape can be presented. It is preferably an overhanging shape such as an inversely tapered shape.

In the case of an inversely tapered shape, the taper angle $\theta$ with respect to the substrate surface may be $0°<\theta<90°$. It is preferably $20°<\theta<80°$, and it is further preferably $30°<\theta<70°$. Incidentally, in the case of an inversely tapered shape, the taper angle $\theta$ denotes a taper angle $\theta_3$ with respect to the surface of the transparent substrate 2 as shown in FIG. 2.

As to the height of the partition walls, in general, the height from the surface of the partition wall base to the surface of the partition wall is set to be higher than the height from the transparent substrate surface to the second transparent electrode layer surface at the central part of the light emitting region.

The width of the partition walls is not particularly limited, and it is preferably 100 μm or less because if the width of the partition walls is too wide, the light emitting region is relatively narrow.

The pitch of the partition walls is not particularly limited so that it is selected optionally according to factors such as the size of the pixels of the transparent organic EL element as a target.

Each partition wall may be constituted from a plurality of small partition walls provided parallel with each other with a predetermined interval. Particularly in the case of forming the organic layer constituting the organic EL layer by the printing process, it is preferable to provide such a small partition wall plurally because the second transparent electrode layer can be divided even in the case the thickness of the organic layer is made thicker in the vicinity of the partition walls due to adhesion of an ink on the side surface of the partition wall.

Figure 8:
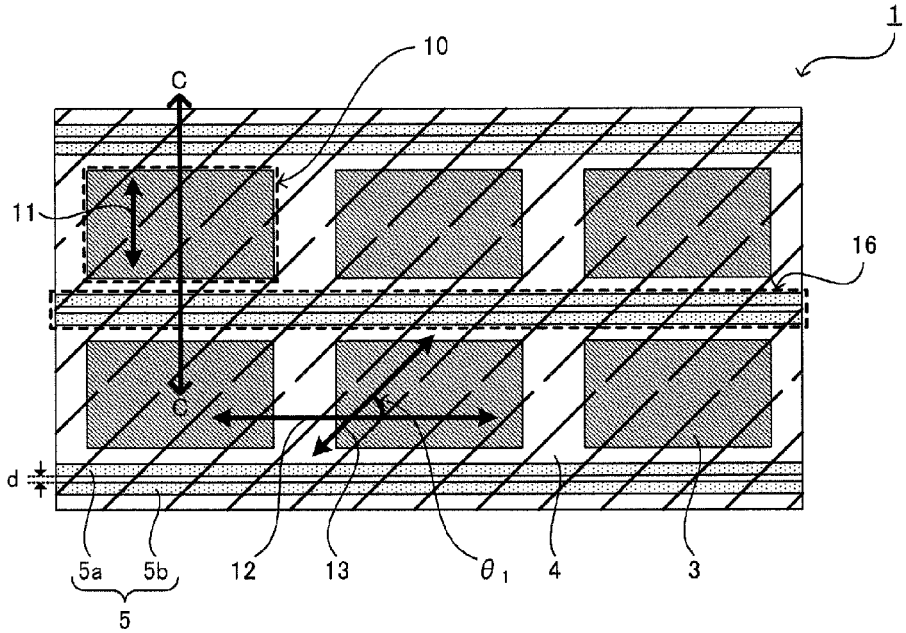
FIG. 8 is a schematic plan view showing another example of a transparent organic EL element of the present invention.
Figure 9:
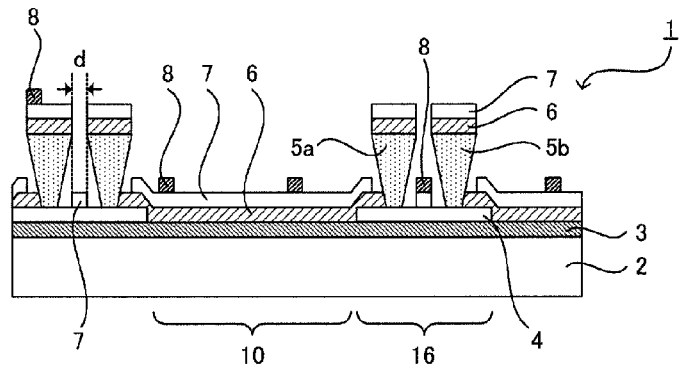
FIG. 9 is a cross-sectional view taken on the line C-C of FIG. 8.

For example, in an example shown in each of FIGS. 8 and 9, each partition wall 5 is constituted from two small partition walls 5a, 5b provided parallel with a predetermined interval "d". Since the interval "d" between the small partition wall 5a and the small partition wall 5b is relatively narrow, in the case of forming the organic layer constituting the organic EL layer 6 by the printing process, entrance of an organic layer forming coating solution between the small partition wall 5a and the small partition wall 5b can be restrained. Therefore, the second transparent electrode layer 7 can certainly be divided so that short-circuit between the second transparent electrode layers 7 disposed with the partition wall 5 therebetween can be prevented. Incidentally, FIG. 8 is a schematic plan view showing another example of the transparent organic EL element of the present invention, and FIG. 9 is a cross-sectional view taken on the line C-C of FIG. 8. In FIG. 8, the organic EL layer and the second transparent electrode layer are omitted.

The interval between the small partition walls may be an interval capable of dividing the second transparent electrode layer. Specifically, it is preferably in a range of 1 μm to it is more preferably in a range of 1 μm to 30 μm, and it is further preferably in a range of 1 μm to 10 μm. If the interval between the small partition walls is wider than the above-mentioned range, in the case of forming the organic layer constituting the organic EL layer by the printing process, the organic layer forming coating solution can easily enter between the small partition walls so that division of the second transparent electrode layer may be difficult. On the other hand, those having an interval between the small partition walls narrower than the above-mentioned range can hardly be formed. Moreover, in the case the interval between the small partition walls is too narrow, the organic layer may be formed continuously between the small partition walls.

Incidentally, the "interval between the small partition walls" denotes a distance from the end part of the upper bottom surface to the end part of the upper bottom surface of adjacent small partition walls facing with each other out of a plurality of small partition walls constituting the partition wall. It can be measured with an optical microscope, a laser microscope, or a scanning type white color interferometer.

The width of the divided region sectioned by the partition walls is preferably 300 μm or less. If the above-mentioned divided region is wider than the above-mentioned range, the light emitting region becomes relatively narrow.

Incidentally, the divided region sectioned by the partition walls denotes a divided region 16 as shown in FIG. 8.

As the material for forming the partition walls, for example, photo curable resins such as a photosensitive polyimide resin, an acrylic resin, a novolak resin, a styrene resin, a phenol resin and a melamine resin, thermally curable resins, and inorganic materials can be presented.

As the method for forming the partition wall, common methods such as the photolithography process, and the printing methods can be used.

4. Second Transparent Electrode Layer

Next, the second transparent electrode layer in the present invention will be explained. The second transparent electrode layer in the present invention is formed on the organic EL layer so as to be divided by the above-mentioned partition walls. The second transparent electrode layer may either be a positive electrode or a negative electrode. It is formed in general as a negative electrode.

In the transparent organic EL element of the present invention, light can be taken out from both sides so that the second transparent electrode layer should be transparent or translucent.

The material for such a second transparent electrode layer is not particularly limited as long as it is a conductive material capable of forming a transparent electrode. For example, conductive oxides such as indium tin oxide (ITO), indium zinc oxide (IZO), tin oxide, zinc oxide, indium oxide and aluminum zinc oxide (AZO), metals such as Au and Ni, and conductive polymers such as polyaniline, polyacetylene, polyalkyl thiophene derivative, and polysilane derivative can be presented.

As the method for forming a film of the second transparent electrode layer, common electrode film formation methods can be used. For example, PVD processes such as the vacuum deposition process, the sputtering process and the ion plating process, CVD processes, and the method of applying a conductive paste can be presented. In particular, the vacuum deposition process and the method of applying a conductive paste are preferable. Since the vacuum deposition process is a dry process, it is a method with little damage on the organic EL layer so that it is suitable for lamination. Moreover, the method of applying a conductive process is a wet process. The wet process is suitable for coping with a large area compared with the dry process. Even in the case of the wet process, a conductive paste incorporated with a solvent which does not affect the organic EL layer can be used. That is, the wet process can also be utilized by devising such that it will not affect the organic EL layer according to the solvent resistance of the organic EL layer, and the like.

5. Organic EL Layer

Next, the organic EL layer in the present invention will be explained. The organic EL layer in the present invention is formed on the first transparent electrode layer in the light emitting region between the partition walls and includes at least a light emitting layer.

Figure 10:
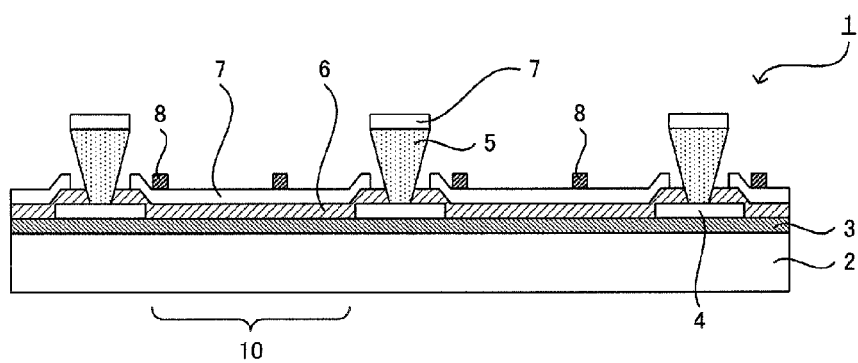
FIG. 10 is a schematic plan view showing another example of a transparent organic EL element of the present invention.

As to the position for forming the organic EL layer, it is sufficient if the organic EL layer is formed on the first transparent electrode layer in the light emitting region between the partition walls. For example, the organic EL layer 6 may be formed on the partition walls 5 as shown in FIG. 2, or the organic EL layer 6 may not be formed on the partition walls 5 as shown in FIG. 10. Moreover, in the case the organic EL layer is formed on the partition walls, the organic EL layer 6 may be formed on the entire surface on the partition walls 5 as shown in FIG. 2, or the organic EL layer may be formed in a part on the partition walls although it is not shown in a figure. Incidentally, FIG. 10 is a schematic cross-sectional view showing another example of the transparent organic EL element of the present invention. The references not explained here are same as those in FIG. 2 so that explanation is omitted here.

The organic EL layer used in the present invention comprises one layer or a plurality of layers of an organic layer including at least a light emitting layer. That is, the organic EL layer refers to a layer including at least a light emitting layer with its layer configuration having one or more layers of organic layer. In general, since a large number of layers can hardly be laminated due to the solvent in the case of forming the organic EL layer by a wet process by coating, it is formed with one or two layers of organic layers in many cases. However, a larger number of layers may be formed by devising the organic material or using the vacuum deposition process in combination.

As the organic layers including the organic EL layer in addition to the light emitting layer, a positive hole injection layer, an electron injection layer, a positive hole transporting layer, an electron transporting layer, and the like can be presented. By providing the positive hole transporting function to the positive hole injection layer, the positive hole transporting layer may be integrated with the positive hole injection layer. Moreover, by providing the electron transporting function to the electron injection layer, the electron transporting layer may be integrated with the electron injection layer. Furthermore, as the organic layers constituting the organic EL layer, a layer such as a carrier block layer for improving the re-coupling efficiency by preventing penetration of the positive hole or the electron can be presented.

Hereafter, the organic EL layer in the present invention will be explained for each configuration.

(1) Light Emitting Layer

As the material used for the light emitting layer in the present invention, for example, light emitting materials as a pigment material, a metal complex material, and a polymer material can be presented.

As the pigment material, a cyclopentadiene derivative, a tetraphenyl butadiene derivative, a triphenyl amine derivative, an oxadiazol derivative, a pyrazoloquinoline derivative, a distylyl benzene derivative, a distylyl arylene derivative, a silole derivative, a thiophene ring compound, a pyridine ring compound, a perinone derivative, a perylene derivative, an oligothiophene derivative, a trifumanyl amine derivative, an oxadiazol dimer, a pyrazoline dimer, and the like can be presented.

Moreover, as the metal complex material, metal complexes having as the central metal Al, Zn, Be, and the like, or the rare earth metals such as Tb, Eu and Dy, and the ligand oxadiazol, thiadiazol, phenyl pyridine, phenyl benzoimidazol, quinoline structure, and the like, such as an alumi quinol complex, a benzo quinolinol beryllium complex, a benzo oxazol zinc complex, a benzo thiazol zinc complex, an azo methyl zinc complex, a porphyrin zinc complex, an europium complex, and the like, can be presented.

Furthermore, as the polymer material, a polyparaphenylene derivative, a polythiophene derivative, a polyparaphenylene derivative, a polysilane derivative, a polyacetylene derivative, a polyvinyl carbazol, and the like; and a polyfluorene derivative, a polyquinoxaline derivative, and a polymer thereof, and the like can be presented.

For improving the light emitting efficiency, changing the light emitting wavelength, and the like, a doping agent may be added into the above-mentioned light emitting layer. As such a doping agent, for example, a perylene derivative, a coumarine derivative, a ruburene derivative, a quinacridone derivative, a squarium derivative, a porphiline derivative, a styryl pigment, a tetracene derivative, a pyrazoline derivative, decacyclene, phenoxazone, a quinoxaline derivative, a carbazol derivative and a fluorine derivative can be presented.

The thickness of the light emitting layer is not particularly limited as long as it is a thickness capable of realizing a light emitting function by providing a field for re-coupling of electrons and positive holes. For example, it may be about 1 nm to 500 nm.

In the present invention, the light emitting layer is divided by the partition walls so as to be formed in a pattern. At the time, it is preferable that the light emitting layer is formed in a pattern so as to have light emitting parts of a plurality of colors such as red, green and blue. Thereby, an organic EL element enabling color display can be provided.

Figure 11:
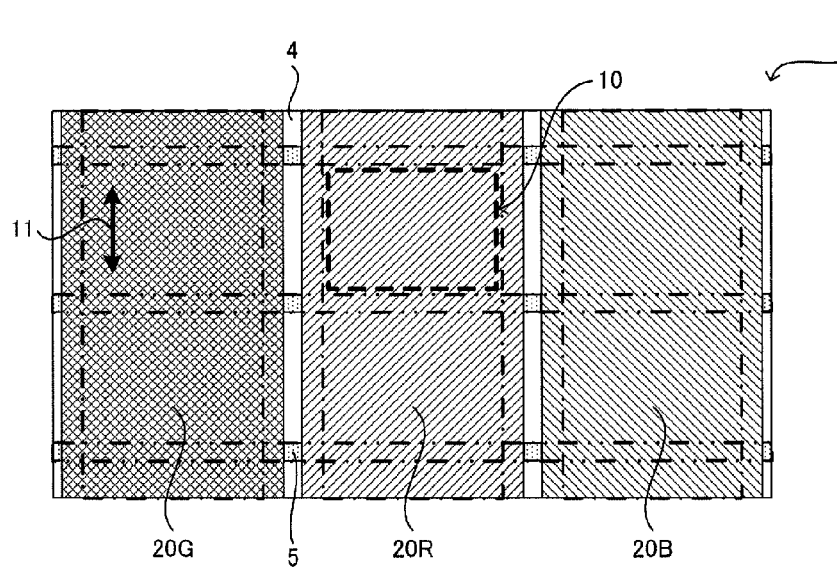
FIG. 11 is a schematic plan view showing another example of a transparent organic EL element of the present invention.

In this case, a red light emitting part 20R, a green light emitting part 20G and a blue light emitting part 20B may be arranged parallel in stripe form with respect to the longitudinal direction 11 of the first transparent electrode layer in stripe form as shown in FIG. 11. Alternatively, a red light emitting part 20R, a green light emitting part 20G and a blue light emitting part 20B may be arranged vertically in stripe form with respect to the longitudinal direction 11 of the first transparent electrode layer in stripe form as shown in FIG. 12.

Figure 12:
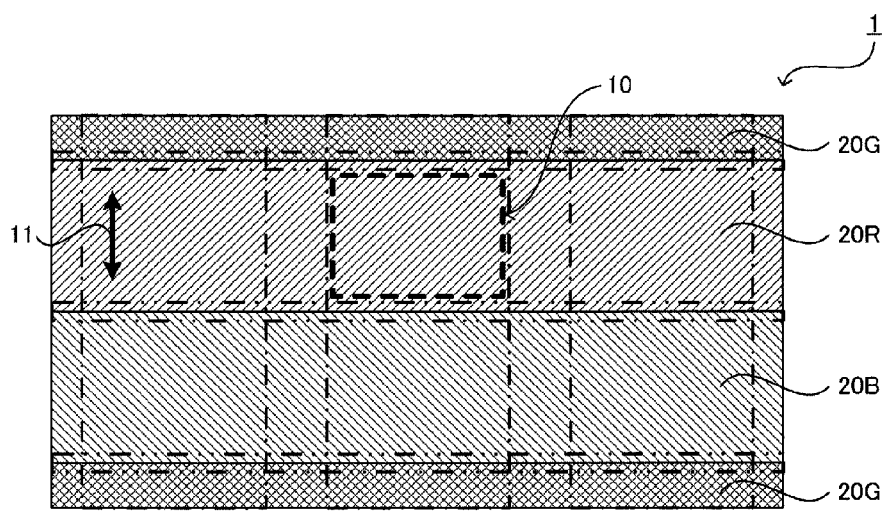
FIG. 12 is a schematic plan view showing another example of a transparent organic EL element of the present invention.

Incidentally, FIGS. 11 and 12 are schematic plan views showing other examples of the transparent organic EL element of the present invention. These figures show the first transparent electrode layer 3 by an alternate long and short dash line and the partition wall 5 by a chain double-dashed line, and the second transparent electrode layer 7 and the first auxiliary electrode layer 8 are omitted.

The method for forming the above-mentioned light emitting layer is not particularly limited as long as it is a method capable of patterning highly precisely. For example, the deposition process, the printing process, the ink jet process, the transfer process, or the dip coating process, the roll coating process, the blade coating process, the spin coating process, the bar coating process, the wire bar coating process, the casting process, and the LB process can be presented.

(2) Positive Hole Injection Layer

As described above, the positive hole transporting layer may be integrated with the positive hole injection layer by providing the positive hole transporting function to the positive hole injection layer. That is, the positive hole injection layer may only have the positive hole injection function, or it may have both the positive hole injection function and the positive hole transporting function.

The material used for the positive hole injection layer is not particularly limited as long as it is a material capable of stabilizing positive hole injection into the light emitting layer. In addition to the compounds presented for the light emitting material of the above-mentioned light emitting layer, a phenyl amine material, a star burst type amine material, a phthalocyanine material, oxides such as vanadium oxide, molybdenum oxide, ruthenium oxide, aluminum oxide and titanium oxide, amorphous carbon, polyaniline, polythiophene, polyphenylene vinylene derivatives, and the like can be used. Specifically, bis(N-(1-naphthyl)-N-phenyl)benzidine (α-NPD), 4,4,4-tris(3-methyl phenyl phenyl amino)triphenyl amine (MTDATA), poly 3,4 ethylene dioxythiophene-polystylene sulfonic acid (PEDOT-PSS), polyvinyl carbazol (PVCz), and the like can be presented.

The thickness of the above-mentioned positive hole injection layer is not particularly limited as long as it is a thickness capable of sufficiently performing the positive hole injection function and the positive hole transporting function. Specifically, it is preferably in a range of 0.5 nm to 1000 nm. It is particularly preferably in a range of 10 nm to 500 nm. Moreover, the method for forming the positive hole injection layer is same as the method for forming the light emitting layer mentioned above.

(3) Electron Injection Layer

As described above, the electron transporting layer may be integrated with the electron injection layer by providing the electron transporting function to the electron injection layer. That is, the electron injection layer may have only the electron injection function, or it may have both the electron injection function and the electron transporting function.

The material used for the electron injection layer is not particularly limited as long as it is a material capable of stabilizing electron injection into the light emitting layer. In addition to the compounds presented for the light emitting material for the above-mentioned light emitting layer, alkaline metals, halides of alkaline metals, organic complexes of alkaline metals, such as alumi lithium alloys, lithium fluoride, strontium, magnesium oxide, magnesium fluoride, strontium fluoride, calcium fluoride, barium fluoride, aluminum oxide, strontium oxide, calcium, polymethyl methacrylate, polystyrene sodium sulfonate, lithium, cesium, and cesium fluoride can be used.

Moreover, a metal doping layer formed by doping an alkaline metal or an alkaline earth metal to an electron transporting organic material can be used also as an electron injection layer. As the above-mentioned electron transporting organic material, for example, bathocuproin, bathophenanthroline, and phenanthroline derivatives can be presented. As the metal to be doped, Li, Cs, Ba, Sr, and the like can be presented.

The thickness of the above-mentioned electron injection layer is not particularly limited as long as it is a thickness capable of sufficiently performing the electron injection function and the electron transporting function. Moreover, as the method for forming the electron injection layer, for example, the vacuum deposition process can be presented.

(4) Electron Transporting Layer

The material used for the electron transporting layer is not particularly limited as long as it is a material enabling transportation of the electron injected form the negative electrode into the light emitting layer. For example, bathocuproin, bathophenanthroline, phenanthroline derivatives, triazol derivatives, oxadiazol derivatives, and derivatives of tris (8-quinolinorato) aluminum complexes ($Alq_3$) can be presented.

The thickness of the above-mentioned electron transporting layer is not particularly limited as long as it is a thickness capable of sufficiently performing the electron transporting function. Moreover, the method for forming the electron transporting layer is same as the method for forming the light emitting layer mentioned above.

6. First Transparent Electrode Layer

Next, the first transparent electron layer in the present invention will be explained. The first transparent electron layer in the present invention is formed on the transparent substrate in stripe form. The first transparent electrode layer may either be a positive electrode or a negative electrode, however, it is formed in general as a positive electrode.

In the transparent organic EL element of the present invention, light can be taken out from both sides so that the first transparent electrode layer should be transparent or translucent.

The material for such a first transparent electrode layer is not particularly limited as long as it is a conductive material capable of forming a transparent electrode. For example, conductive oxides such as indium tin oxide (ITO), indium zinc oxide (IZO), tin oxide, zinc oxide, indium oxide and aluminum zinc oxide (AZO), metals such as Au and Ni, and conductive polymers such as polyaniline, polyacetylene, polyalkyl thiophene derivative, and polysilane derivative can be presented.

As the method for forming a film of the first transparent electrode layer, common electrode film formation methods can be used. For example, PVD processes such as the vacuum deposition process, the sputtering process and the ion plating process, and CVD processes can be presented. The method for patterning the first transparent electrode layer is not particularly limited as long as it is a method capable of precisely forming a desired pattern. Specifically, the photolithography process, and the like can be presented.

7. Transparent Substrate

Next, the transparent substrate in the present invention will be explained. The transparent substrate in the present invention is not particularly limited as long as it can support members such as the partition walls, the first transparent electrode layer described above with a predetermined strength. In the present invention, in the case the first transparent electrode layer has a predetermined strength, the first transparent electrode layer may also serve as the transparent substrate, however, in general, the first transparent electrode layer is formed on the transparent substrate having a predetermined strength.

As the material for forming such a transparent substrate, for example, glass plates made of soda-lime glass, alkaline glass, lead alkaline glass, borosilicate glass, aluminosilicate glass, and silica glass, and a resin substrate to be formed in a film-like shape can be used. As the resin used for the resin substrate, it is preferably a polymer material having relatively high solvent resistance and heat resistance. Specifically, a fluorine resin, polyethylene, polypropylene, polyvinyl chloride, polyvinyl fluoride, polystyrene, an ABS resin, polyamide, polyacetal, polyester, polycarbonate, modified polyphenylene ether, polysulfone, polyallylate, polyether imide, polyether sulfon, polyamideimide, polyimide, polyphenylene sulfide, liquid crystalline polyester, polyethylene terephthalate, polybutylene terephthalate, polyethylene naphthalate, polymicroyxylene dimethylene terephthalate, polyoxymethylene, polyether sulfone, polyether ether ketone, polyacrylate, an acrylonitrile-styrene resin, a phenol resin, a urea resin, a melamine resin, an unsaturated polyester resin, an epoxy resin, polyurethane, a silicone resin, amorphous polyolefin, and the like can be presented. Moreover, in addition to the above-mentioned, polymer materials satisfying a predetermined condition can also be used, and a copolymer of two or more kinds can be used as well. Furthermore, as needed, a transparent substrate having a gas barrier property of blocking a gas such as moisture content and oxygen may be used.

8. Insulation Layer

In the present invention, it is preferable that an insulation layer is formed between the first transparent electrode layer and the partition wall because short-circuit caused by the contact of the first transparent electrode layer and the second transparent electrode layer can be prevented. The insulation layer is formed preferably so as to cover the end part of the first transparent electrode layer. Since the thickness of the organic EL layer is thinner at the end part of the first transparent electrode layer, short-circuit can be prevented by forming the insulation layer. Moreover, electric connection of the adjacent light emitting regions can also be prevented. The portion with the insulation layer formed is a region not contributing to the light emission.

As to the position for forming the insulation layer, the insulation layer may be formed so as to expose the first transparent electrode layer in the light emitting region. The size of the light emitting region is not particularly limited so that it is set optionally according to factors such as the application of the transparent organic EL element.

As the material for forming the insulation layer, photo curable resins such as a photosensitive polyimide resin and an acrylic resin, thermally curable resins, inorganic materials, and the like can be presented.

As the method for forming the insulation layer, common methods such as the photolithography process, and the printing methods can be used.

9. Others

The transparent organic EL element of the present invention has the first transparent electrode layer and the second transparent electrode layer formed in stripe form so as to intersect with each other. It is used preferably as a passive type transparent organic EL element.

B. Production Method for a Transparent Organic EL Element

Next, the production method for a transparent organic EL element of the present invention will be explained. The production method of the present invention is a production method for a transparent organic EL element comprising: a transparent substrate, a first transparent electrode layer 5 formed on the above-mentioned transparent substrate in stripe form, an insulating partition wall formed in stripe form in a direction orthogonal to the longitudinal direction of the first transparent electrode layer on the above-mentioned transparent substrate with the above-mentioned first transparent electrode layer formed, an organic EL layer including a light emitting layer and formed on the above-mentioned first transparent electrode layer in the light emitting region between the above-mentioned partition walls, a second transparent electrode layer formed on the above-mentioned organic EL layer and divided with the above-mentioned partition wall, a first auxiliary electrode group formed on the above-mentioned second transparent electrode layer and comprising a plurality of metal fine lines disposed parallel with each other, and a second auxiliary electrode group formed on the above-mentioned second transparent electrode layer so as to intersect the above-mentioned first auxiliary electrode group and comprising a plurality of metal fine lines disposed parallel with each other, comprising steps of: a first auxiliary electrode group forming step of forming the above-mentioned first auxiliary electrode group so that an angle $\theta_1$ is $0°<\theta_1<90°$ with the premise that the angle formed by the longitudinal direction of the above-mentioned partition wall and the elongation direction of the fine lines of the above-mentioned first auxiliary electrode group is $\theta_1$, and a second auxiliary electrode group forming step of forming the above-mentioned second auxiliary electrode group so that an angle $\theta_2$ is $0°<\theta_2\leq90°$ with the premise that the angle formed by the elongation direction of the fine lines of the above-mentioned first auxiliary electrode group and the elongation direction of the fine lines of the above-mentioned second auxiliary electrode group is $\theta_2$.

Figure 13A:
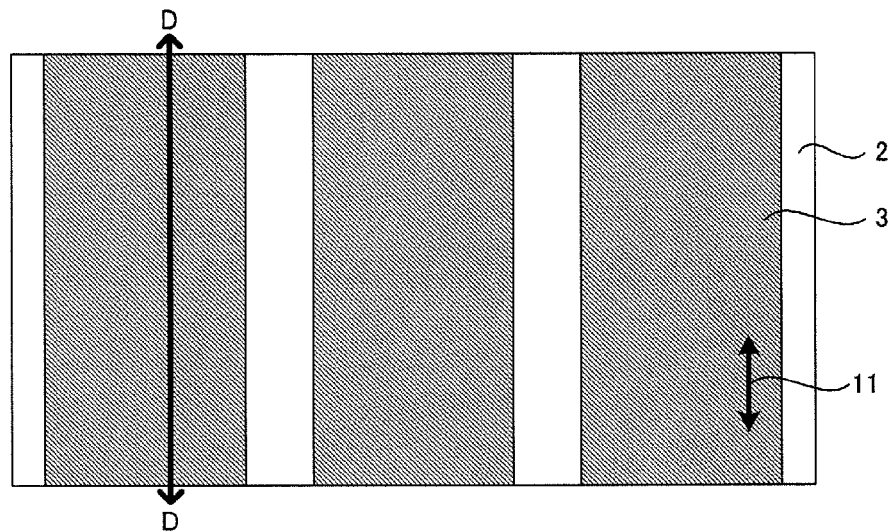
FIGS. 13A to 13C are a process diagram showing an example of a production method for a transparent organic EL element of the present invention.
Figure 13B:
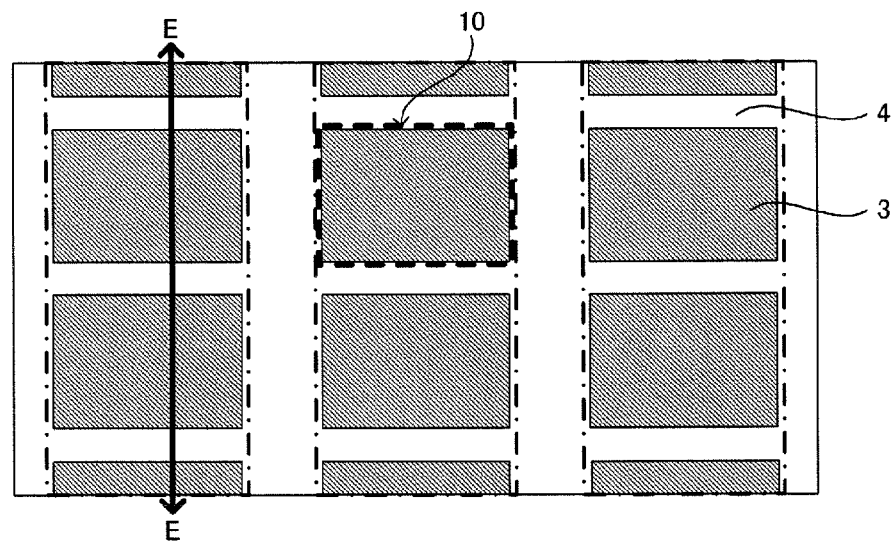
Figure 13C:
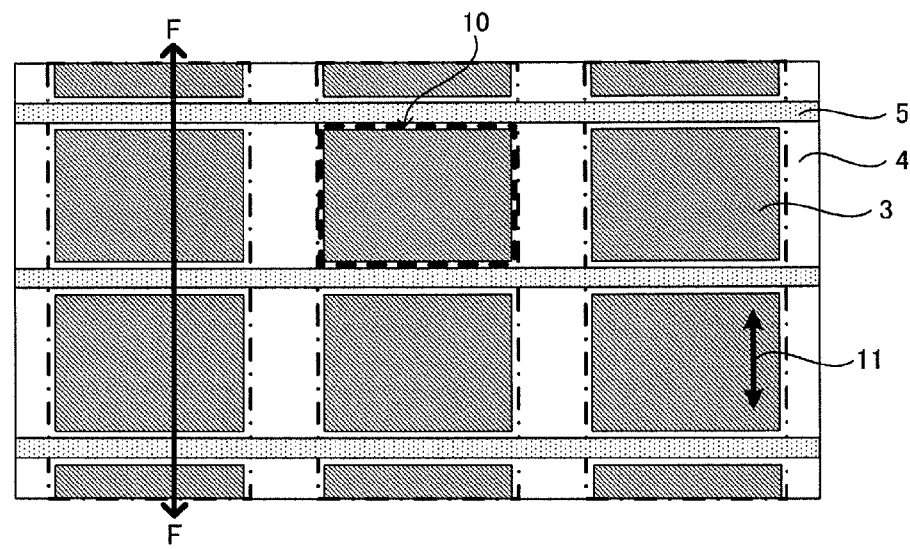
Figure 15A:
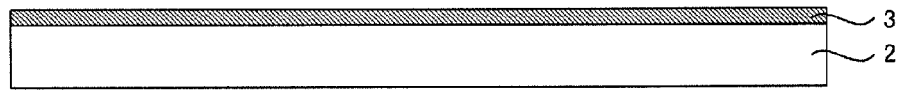
FIGS. 15A to 15F area process diagram showing an example of a production method for a transparent organic EL element of the present invention.
Figure 15B:
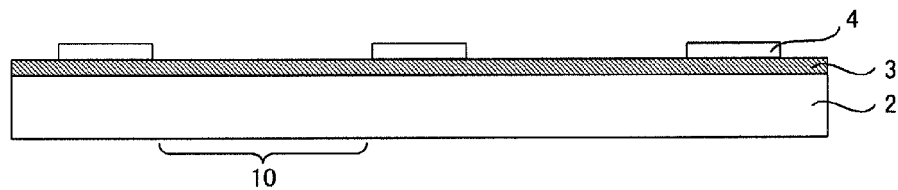
Figure 15C:
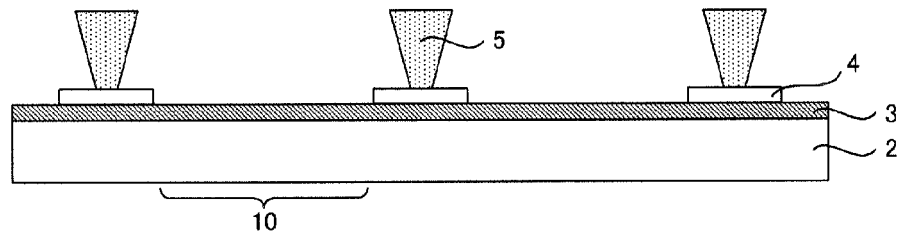
Figure 15D:
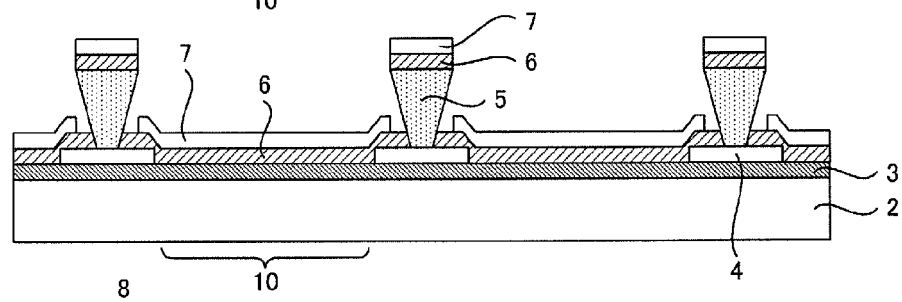
Figure 15E:
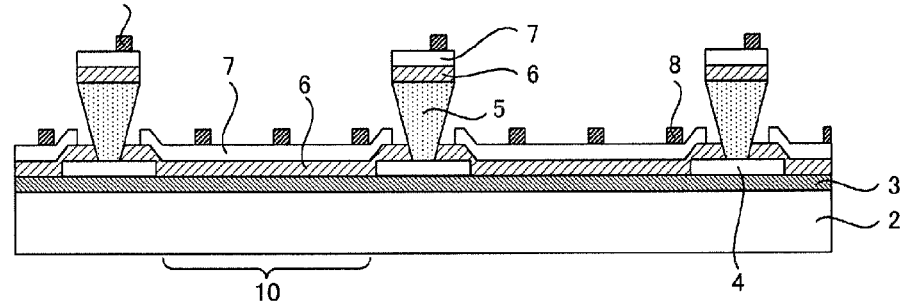
Figure 15F:
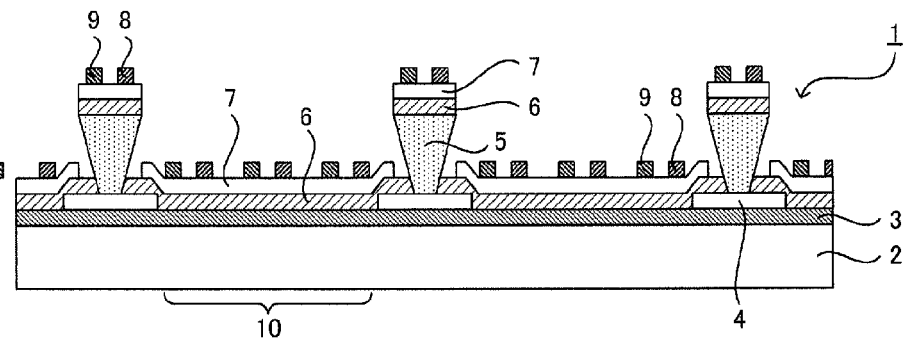

The production method for a transparent organic EL element of the present invention will be explained with reference to the drawings. FIGS. 13 to 15 are process diagrams showing an example of a production method for a transparent organic EL element of the present invention. Incidentally, FIGS. 13A to 13C and FIGS. 14A to 14C are schematic plan views. FIG. 15A is a cross-sectional view taken on the line D-D of FIG. 13A. FIG. 15B is a cross-sectional view taken on the line E-E of FIG. 13B. FIG. 15C is a cross-sectional view taken on the line F-F of FIG. 13C. FIG. 15D is a cross-sectional view taken on the line G-G of FIG. 14A. FIG. 15E is a cross-sectional view taken on the line H-H of FIG. 14B. FIG. 15F is a cross-sectional view taken on the line I-I of FIG. 14C. FIGS. 13B to 13C and FIGS. 14A to 14C show the first transparent electrode layer 3 by an alternate long and short dash line. FIGS. 14A to 14C show the partition wall 5 by a chain double-dashed line.

First, the first transparent electrode layer 3 is formed in stripe form on the transparent substrate 2 (FIGS. 13A and 15A). Then, the insulation layer 4 is formed so as to expose the first transparent electrode layer 3 in the light emitting region 10 on the transparent substrate 2 with the first transparent electrode layer 3 formed (FIGS. 13B and 15B). Then, the partition walls 5 with an insulation property is formed in stripe form elongating in a direction orthogonal to the longitudinal direction 11 of the first transparent electrode layer on the insulation layer 4 (FIGS. 13C and 15C).

Subsequently, the organic EL layer 6 is formed on the entire surface of the transparent substrate 2 with the partition walls 5 formed. Furthermore, the second transparent electrode layer 7 is formed on the organic El layer 6 (FIGS. 14A and 15D). Then, the first auxiliary electrode group 8 is formed on the second transparent electrode layer 7 by for example the deposition process using a metal mask so as to satisfy $0°<\theta_1<90°$ with the premise that the angle formed by the longitudinal direction 12 of the partition walls and the elongation direction 13 of the fine lines of the first auxiliary electrode group is $\theta_1$ (FIGS. 14B and 15E, first auxiliary electrode group forming step). Then, the second auxiliary electrode group 9 is formed by for example the deposition process using a metal mask so as to satisfy $0°<\theta_2\leq90°$ with the premise that the angle formed by the elongation direction 13 of the fine lines of the first auxiliary electrode group and the elongation direction 14 of the fine lines of the second auxiliary electrode group is $\theta_2$ (FIGS. 14C and 15F, second auxiliary electrode group forming step). Thereby, a transparent organic EL element 1 with the first auxiliary electrode group 8 and the second auxiliary electrode group 9 formed intersect with each other is obtained on the second transparent electrode layer 7 formed in the light emitting region 10 between the partition walls 5.

According to the present invention, since the auxiliary electrodes are formed by each forming the first auxiliary electrode group and the second auxiliary electrode group by a predetermined angle direction so as to intersect with each other, the auxiliary electrodes can be formed continuously without a gap on the second transparent electrode layer formed in the light emitting region between the partition walls certainly and easily so that the resistance of the second transparent electrode layer can be lowered. Moreover, even in the case the auxiliary electrodes are out of alignment, the contact of the first auxiliary electrode group and the second auxiliary electrode group can be ensured. Moreover, since there is no risk of short-circuit owing to the partition walls, alignment of the auxiliary electrodes need not be adjusted so that the production tact can be shortened.

Hereafter, steps in the production method for a transparent organic EL element of the present invention will be explained.

1. First Auxiliary Electrode Group Forming Step

First, the first auxiliary electrode group forming step in the present invention will be explained. The first auxiliary electrode group forming step in the present invention is a step of forming a first auxiliary electrode group so that an angle $\theta_1$ is $0°<\theta_1<90°$ with the premise that the angle formed by the longitudinal direction of the partition walls and the elongation direction of the fine lines of the first auxiliary electrode group is $\theta_1$.

Since the first auxiliary electrode group and its forming method are mentioned in "A. Transparent organic EL element" mentioned above, explanation is omitted here.

2. Second Auxiliary Electrode Group Forming Step

Next, the second auxiliary electrode group forming step in the present invention will be explained. The second auxiliary electrode group forming step in the present invention is a step of forming a second auxiliary electrode group so that an angle $\theta_2$ is $0°<\theta_2\leq90°$ with the premise that the angle formed by the elongation direction of the fine lines of the first auxiliary electrode group and the elongation direction of the fine lines of the second auxiliary electrode group is $\theta_2$.

Since the second auxiliary electrode group and its forming method are mentioned in "A. Transparent organic EL element" mentioned above, explanation is omitted here.

3. Other Steps

The production method for an organic EL element of the present invention may comprise, in addition to the essential steps including the first auxiliary electrode group forming step and the second auxiliary electrode group forming step mentioned above, a first transparent electrode layer forming step, an insulation layer forming step, a partition wall forming step, an organic EL layer forming step, a second transparent electrode layer forming step, and the like.

Incidentally, since the first transparent electrode layer and its forming step, the insulation layer and its forming step, the partition wall and its forming step, the organic EL layer and its forming step, the second transparent electrode layer and its forming step, and the like are mentioned in "A. Transparent organic EL element" mentioned above, explanation is omitted here.

The present invention is not limited to the above-mentioned embodiments. The above-mentioned embodiments are examples, and thus anyone having a configuration substantially same as that of the technical idea disclosed in the claims of the present invention so as to achieve the same effects is incorporated in the technical scope of the present invention.

EXAMPLES

Hereafter, the present invention will be explained specifically using examples and comparative examples.

Example

Formation of the First Transparent Electrode Layer

First, 100 sets of first transparent electrode layers of 0.8 mm width and 30 mm length in stripe form were formed by first forming an indium tin oxide (ITO) electrode film by a 200 nm film thickness by the ion plating process to a glass substrate (thickness: 0.7 mm), applying a photosensitive resist onto the ITO electrode film, followed by mask exposure, development, etching of the ITO electrode film, and then removing the resist.

(Formation of the Insulation Layer)

Then, an insulation layer (thickness: 1.5 μm) was formed so that a 0.7 mm×0.7 mm light emitting region (opening part) each present on the first transparent electrode layer by a 1 mm pitch by applying a washing process and ultraviolet ray plasma washing on the glass substrate with the above-mentioned first transparent electrode layer formed, then applying a positive type photosensitive resist including as the main component a polyimide precursor by the spin coating process, and patterning the same by the photolithography process.

(Formation of the Partition Walls)

Then, a washing process and ultraviolet ray plasma washing were applied to the glass substrate with the above-mentioned insulation layer formed, and then a partition wall forming solution was applied thereto by the spin coating process. Then, a heat treatment (prebaking) was carried out for obtaining a resist film of about a 4 μm thickness.

Subsequently, after exposing the resist film in a pattern with an ultraviolet ray using a photo mask having a large number of slits with a 20 μm opening part width, a heat treatment (PEB: post exposure bake) was carried out.

Thereafter, a resist pattern was formed by developing the substrate with the above-mentioned resist film formed with an alkaline developing solution, and it was hardened by a heat treatment (post-baking) so that 11 partition walls were formed by a 1 mm pitch in stripe form of 30 μm width and 200 mm length with an inverted tapered shape cross-sectional shape so as to be orthogonal to the first transparent electrode layer on the insulation layer.

(Formation of the Organic EL Layer)

Then, a positive hole injection layer was formed on the first transparent electrode layer with the above-mentioned partition walls formed by the gravure offset printing process. That is, in order to obtain a desired film thickness, the cell shape of the gravure block and the ink concentration were adjusted. With the gravure block and the blanket mounted on a flat base offset printing machine, an ink for the positive hole injection layer (polyethylene dioxythiophene-polystyrene sulfonate (PEDOT-PSS)) was supplied to the gravure block for filling the cells with the ink for the positive hole injection layer. Subsequently, the ink for the positive hole injection layer was received from the gravure block to the blanket. Thereafter, by transferring the ink for the positive hole injection layer from the blanket onto the substrate with the partition walls formed, a positive hole injection layer divided by the partition walls was formed.

Then, in the same manner, using an ink for a light emitting layer (polyfluorene derivative-based green light emitting material), a light emitting layer was formed by the gravure offset printing process.

Subsequently, an electron injection layer was formed on the light emitting layer by forming a film of calcium by 20 nm thickness by the vacuum deposition process using a metal mask.

(Formation of the Second Transparent Electrode Layer)

Then, a second transparent electrode layer was formed by forming a film of an indium zinc oxide (IZO) electrode film (thickness: 150 nm) by the sputtering process on the above-mentioned electron injection layer. At the time, the argon gas introduction amount or the oxygen gas introduction amount was varied with the oxygen ratio (oxygen/argon ratio)=0.04 having 0.2 cc oxygen gas introduction amount and 5.0 cc argon gas introduction amount provided as the reference so that the oxygen ratio (oxygen/argon ratio) was changed from 0.00 to 0.20. Moreover, the pressure was set to be 0.2 Pa, the output DC 900 W, and the film formation rate 12.0 Å/s.

(Formation of the Auxiliary Electrode)

Then, a first auxiliary electrode group was formed by forming a film of an aluminum by 300 nm thickness by the vacuum deposition process with $\theta_1=45°$ via a metal mask having a 70 μm width opening part on the above-mentioned second transparent electrode layer.

Furthermore, a second auxiliary electrode group was formed by forming a film of an aluminum by 300 nm thickness by the vacuum deposition process with $\theta_2=90°$ via a metal mask having a 70 μm width opening part so as to intersect the above-mentioned first auxiliary electrode group.

(Sealing)

Thereafter, by sealing the second transparent electrode layer side with a sealing glass and an adhesive, an EL display device was produced.

Comparative Example

An EL display device was produced in the same manner as in the example except that the auxiliary electrodes (first auxiliary electrode group and second auxiliary electrode group) were not formed.

[Evaluation]

In the example, the luminance difference of the pixels at both end parts in the longitudinal direction of the second transparent electrode layer was within 10%. On the other hand, in the comparative example, the luminance difference of the pixels on both end parts in the longitudinal direction of the second transparent electrode layer was 50% so that luminance irregularity was observed. It is attributed to the reduction of the resistance of the second transparent electrode layer owing to formation of the auxiliary electrode in the example.

REFERENCE SINGS LIST

1 Transparent organic EL element
2 Transparent substrate

3 First transparent electrode layer
4 Insulation layer
5 Partition wall
5a, 5b Small partition wall
6 Organic EL layer
7 Second transparent electrode layer
8 First auxiliary electrode group
9 Second auxiliary electrode group
10 Light emitting region
11 Longitudinal direction of the first transparent electrode layer
12 Longitudinal direction of the partition wall
13 Elongation direction of the fine lines of the first auxiliary electrode group
14 Elongation direction of the fine lines of the second auxiliary electrode group
15 Disconnecting part
16 Divided region

The invention claimed is:

1. A transparent organic electroluminescent element comprising:
a transparent substrate,
a first transparent electrode layer formed on the transparent substrate in stripe form,
insulating partition walls formed in stripe form in a direction orthogonal to a longitudinal direction of the first transparent electrode layer on the transparent substrate with the first transparent electrode layer formed,
an organic electroluminescent layer including a light emitting layer and formed on the first transparent electrode layer in a light emitting region between the insulating partition walls,
a second transparent electrode layer formed on the organic electroluminescent layer and divided with the insulating partition walls, and
a first auxiliary electrode group formed on the second transparent electrode layer and comprising a plurality of metal fine lines disposed parallel with each other,
wherein an angle $\theta_1$ is $0° < \theta_1 < 90°$ with a premise that the angle formed by the longitudinal direction of the insulating partition walls and an elongation direction of the fine lines of the first auxiliary electrode group is $\theta_1$.

2. The transparent organic electroluminescence element according to claim 1, wherein a pitch of the fine lines of the first auxiliary electrode group is narrower than a pitch of the insulating partition walls.

3. The transparent organic electroluminescence element according to claim 2, wherein a second auxiliary electrode group is formed on the second transparent electrode layer so as to intersect the first auxiliary electrode group and comprises a plurality of metal fine lines disposed parallel with each other,
an angle $\theta_2$ is $0° < \theta_2 \leq 90°$ with a premise that the angle formed by the elongation direction of the fine lines of the first auxiliary electrode group and an elongation direction of the fine lines of the second auxiliary electrode group is $\theta_2$, and
the first auxiliary electrode group and the second auxiliary electrode group are provided continuously without a break along the longitudinal direction of the insulating partition walls.

4. The transparent organic electroluminescence element according to claim 1, wherein a second auxiliary electrode group is formed on the second transparent electrode layer so as to intersect the first auxiliary electrode group and comprises a plurality of metal fine lines disposed parallel with each other,
an angle $\theta_2$ is $0° < \theta_2 \leq 90°$ with a premise that the angle formed by the elongation direction of the fine lines of the first auxiliary electrode group and an elongation direction of the fine lines of the second auxiliary electrode group is $\theta_2$, and
the first auxiliary electrode group and the second auxiliary electrode group are provided continuously without a break along the longitudinal direction of the insulating partition walls.

5. A transparent organic electroluminescent element comprising:
a transparent substrate,
a first transparent electrode layer formed on the transparent substrate in stripe form,
insulating partition walls formed in stripe form in a direction orthogonal to a longitudinal direction of the first transparent electrode layer on the transparent substrate with the first transparent electrode layer formed,
an organic electroluminescent layer including a light emitting layer and formed on the first transparent electrode layer in a light emitting region between the insulating partition walls,
a second transparent electrode layer formed on the organic electroluminescent layer and divided with the insulating partition walls, and
a first auxiliary electrode group formed on the second transparent electrode layer and comprising a plurality of metal fine lines disposed parallel with each other,
wherein a pitch of the fine lines of the first auxiliary electrode group is narrower than a pitch of the insulating partition walls.

6. The transparent organic electroluminescence element according to claim 5, wherein a second auxiliary electrode group is formed on the second transparent electrode layer so as to intersect the first auxiliary electrode group and comprises a plurality of metal fine lines disposed parallel with each other,
an angle $\theta_2$ is $0° < \theta_2 \leq 90°$ with a premise that the angle formed by an elongation direction of the fine lines of the first auxiliary electrode group and an elongation direction of the fine lines of the second auxiliary electrode group is $\theta_2$, and
the first auxiliary electrode group and the second auxiliary electrode group are provided continuously without a break along a longitudinal direction of the insulating partition walls.

7. A production method for a transparent organic electroluminescent element comprising: a transparent substrate, a first transparent electrode layer formed on the transparent substrate in stripe form, insulating partition walls formed in stripe form in a direction orthogonal to a longitudinal direction of the first transparent electrode layer on the transparent substrate with the first transparent electrode layer formed, an organic electroluminescent layer including a light emitting layer and formed on the first transparent electrode layer in a light emitting region between the insulating partition walls, a second transparent electrode layer formed on the organic electroluminescent layer and divided with the insulating partition walls, a first auxiliary electrode group formed on the second transparent electrode layer and comprising a plurality of metal fine lines disposed parallel with each other, and a second auxiliary electrode group formed on the second transparent electrode layer so as to intersect the first auxiliary electrode group and comprising a plurality of metal fine lines disposed parallel with each other, comprising steps of:
the first auxiliary electrode group forming step of forming the first auxiliary electrode group so that an angle $\theta_1$ is $0° < \theta_1 < 90°$ with a premise that the angle formed by a longitudinal direction of the insulating partition walls and an elongation direction of the fine lines of the first auxiliary electrode group is $\theta_1$, and the second auxiliary electrode group forming step of forming the second auxiliary electrode group so that an angle $\theta_2$ is $0° < \theta_2 \leq 90°$ with a premise that the angle formed by the elongation direction of the fine lines of the first auxiliary electrode group and an elongation direction of the fine lines of the second auxiliary electrode group is $\theta_2$.

\* \* \* \* \*